(12) United States Patent
Dakshinamurthy et al.

(10) Patent No.: US 9,197,175 B2
(45) Date of Patent: Nov. 24, 2015

(54) METHODS AND SYSTEMS FOR PRE-EMPHASIS OF AN ENVELOPE TRACKING POWER AMPLIFIER SUPPLY VOLTAGE

(75) Inventors: Sriraman Dakshinamurthy, San Jose, CA (US); Robert Lorenz, Menlo Park, CA (US)

(73) Assignee: Broadcom Corporation, Irvine, CA (US)

( * ) Notice: Subject to any disclaimer, the term of this patent is extended or adjusted under 35 U.S.C. 154(b) by 568 days.

(21) Appl. No.: 13/492,279

(22) Filed: Jun. 8, 2012

(65) Prior Publication Data

US 2013/0109442 A1 May 2, 2013

Related U.S. Application Data

(60) Provisional application No. 61/494,848, filed on Jun. 8, 2011, provisional application No. 61/611,718, filed on Mar. 16, 2012.

(51) Int. Cl.
| | |
|---|---|
| *H01Q 11/12* | (2006.01) |
| *H04B 1/04* | (2006.01) |
| *H03G 3/20* | (2006.01) |
| *H04B 1/40* | (2015.01) |
| *H03G 3/30* | (2006.01) |

(52) U.S. Cl.
CPC ............... *H03G 3/20* (2013.01); *H03G 3/3047* (2013.01); *H04B 1/40* (2013.01)

(58) Field of Classification Search
USPC ................................. 455/102–113, 126–127.5
See application file for complete search history.

(56) References Cited

U.S. PATENT DOCUMENTS

| | | | | |
|---|---|---|---|---|
| 6,141,541 | A * | 10/2000 | Midya et al. ..................... 455/91 |
| 6,256,482 | B1 * | 7/2001 | Raab ............................. 455/108 |
| 7,135,918 | B1 * | 11/2006 | Outaleb et al. .................. 330/10 |
| 7,620,377 | B2 * | 11/2009 | Dwyer ......................... 455/108 |
| 7,742,748 | B2 * | 6/2010 | Matero et al. .............. 455/114.3 |
| 7,912,145 | B2 * | 3/2011 | Yellin et al. .................. 375/295 |
| 8,107,898 | B2 * | 1/2012 | Matsuura ...................... 455/102 |
| 8,160,519 | B2 * | 4/2012 | Nentwig .................... 455/127.1 |
| 8,190,111 | B2 * | 5/2012 | Feltgen et al. ............. 455/180.3 |
| 8,204,456 | B2 * | 6/2012 | Xu et al. .................... 455/114.3 |
| 8,411,788 | B2 * | 4/2013 | Sahota ......................... 375/295 |
| 8,653,902 | B2 * | 2/2014 | Kitamura ...................... 332/103 |
| 2007/0121708 | A1 * | 5/2007 | Simpson ....................... 375/149 |
| 2008/0057881 | A1 * | 3/2008 | Dwyer ........................ 455/108 |
| 2009/0045872 | A1 * | 2/2009 | Kenington .................... 330/127 |
| 2009/0256630 | A1 * | 10/2009 | Brobston ......................... 330/2 |
| 2009/0268791 | A1 * | 10/2009 | Waheed et al. ............... 375/219 |
| 2010/0060358 | A1 * | 3/2010 | Nentwig ....................... 330/199 |
| 2010/0233977 | A1 * | 9/2010 | Minnis et al. .............. 455/127.1 |

* cited by examiner

*Primary Examiner* — Edward Urban
*Assistant Examiner* — Rui Hu
(74) *Attorney, Agent, or Firm* — Sterne, Kessler, Goldstein & Fox P.L.L.C.

(57) ABSTRACT

Embodiments provide systems and methods for producing an envelope tracking (ET) PA supply voltage with minimum headroom relative to the desired RF output signal of the PA. In an embodiment, the PA supply voltage is generated by applying an ET signal to an ET path of the wireless device, and by further applying pre-emphasis to the ET signal to compensate for a frequency response of the ET path. Embodiments operate by estimating the frequency response of the ET path and determining the pre-emphasis based on the estimate of the frequency response of the ET path. In embodiments, the pre-emphasis is applied using a pre-emphasis filter, which may be within or outside of the ET path. Further, the pre-emphasis may be applied to the ET signal in digital or analog form.

18 Claims, 6 Drawing Sheets

US 9,197,175 B2

METHODS AND SYSTEMS FOR PRE-EMPHASIS OF AN ENVELOPE TRACKING POWER AMPLIFIER SUPPLY VOLTAGE

CROSS-REFERENCE TO RELATED APPLICATIONS

The present invention claims the benefit of U.S. Provisional Application No. 61/494,848, filed Jun. 8, 2011, and U.S. Provisional Application No. 61/611,718, filed Mar. 16, 2012, both of which are incorporated herein by reference in their entireties.

BACKGROUND

1. Field of the Invention

The present invention relates generally to radio frequency (RF) transceivers.

2. Background Art

In a wireless device, the power efficiency of a power amplifier (PA) can be increased by having the PA supply voltage signal track the instantaneous power being produced by the PA. This, however, requires the PA supply voltage to have at least as much bandwidth as the envelope of the desired transmit signal.

Commonly, the PA supply voltage is produced using a circuit path with a low-pass transfer function. As such, high frequency components of the envelope of the desired transmit signal are attenuated, and the envelope tracking performance may be degraded when the desired transmit signal envelope has greater bandwidth than the circuit path can support.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
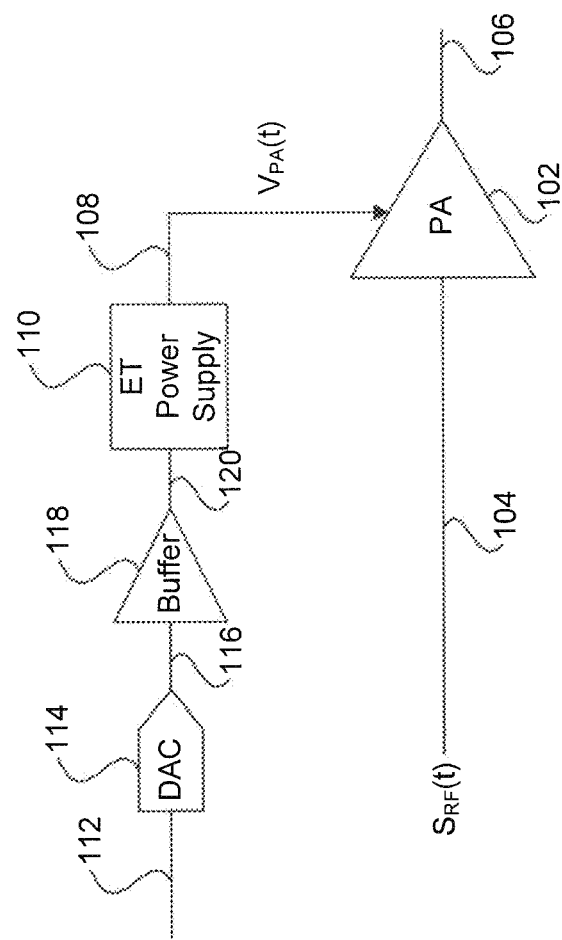
FIG. 1 illustrates a portion of example radio frequency (RF) transmitter according to an embodiment of the present invention.

FIG. 1 illustrates a portion of an example RF transmitter 100 according to an embodiment of the present invention. As shown in FIG. 1, example RF transmitter 100 includes a power amplifier (PA) 102, an envelope tracking (ET) power supply 110, a buffer 119, and a digital-to-analog converter (DAC) 114.

As shown in FIG. 1, PA 102 receives a radio frequency (RF) input signal 104 and generates a RF output signal 106. RF input signal 104 is typically generated by up-converting a complex (having in-phase (I) and quadrature (Q) components) baseband transmit signal (not shown in FIG. 1) to RF. The transmit signal is typically produced by a baseband processor (not shown in FIG. 1) of the wireless device to generate a desired output waveform at RF output signal 106.

Instead of receiving a fixed supply voltage (e.g., $V_{DD}$), PA 102 receives a supply voltage 108 from envelope tracking (ET) power supply 110. ET power supply 110 generates PA supply voltage 108 based on an ET signal 112. Typically, ET signal 112 is generated by the baseband processor, and has a known relationship to the transmit signal or, correspondingly, the desired output waveform. In an embodiment, ET signal 112 is related to the envelope (e.g., scaled and offset version of the envelope) of the desired transmit signal.

Accordingly, ET power supply 110 dynamically regulates PA supply voltage 108 according to the desired output waveform. By having PA supply voltage 108 track the envelope of the desired transmit signal, PA 102 is supplied with as much voltage as instantaneously necessary to produce the desired output waveform. Typically, PA supply voltage 108 is designed to provide PA 102 a minimum headroom (commonly few hundred milliVolts) above what is needed to produce the desired output waveform. This headroom accounts for any temperature, process, or load impedance variations that may affect the performance of the PA. As such, the power efficiency of PA 102 can be significantly enhanced.

To generate PA supply voltage 108, ET signal 112 is applied to an ET path of the wireless device. The ET path includes, among other components, a digital-to-analog (DAC) converter 114 and a buffer 118. DAC 114 converts ET signal 112 from digital to analog to generate an analog ET signal 116. Analog ET signal 116 is then applied to buffer 118 to generate a signal 120, based on which PA supply voltage 108 is produced.

In order for PA supply voltage 108 to accurately track the envelope of the transmit signal, the ET path must have bandwidth sufficient to pass substantially the entire bandwidth of ET signal 112 at all times. Typically, the ET path is characterized by a low-pass transfer function. This low-pass transfer function does not limit the ET operation provided by the ET path for low bandwidth signals, such as WCDMA, for example (which requires only 2 MHz of signal bandwidth). However, for high bandwidth signals, such as LTE, for example (which requires up to 18 MHz of signal bandwidth), it could lead to degradation in envelope tracking performance, which manifests itself in RF output distortion and increased out-of-band emissions.

Figure 2:
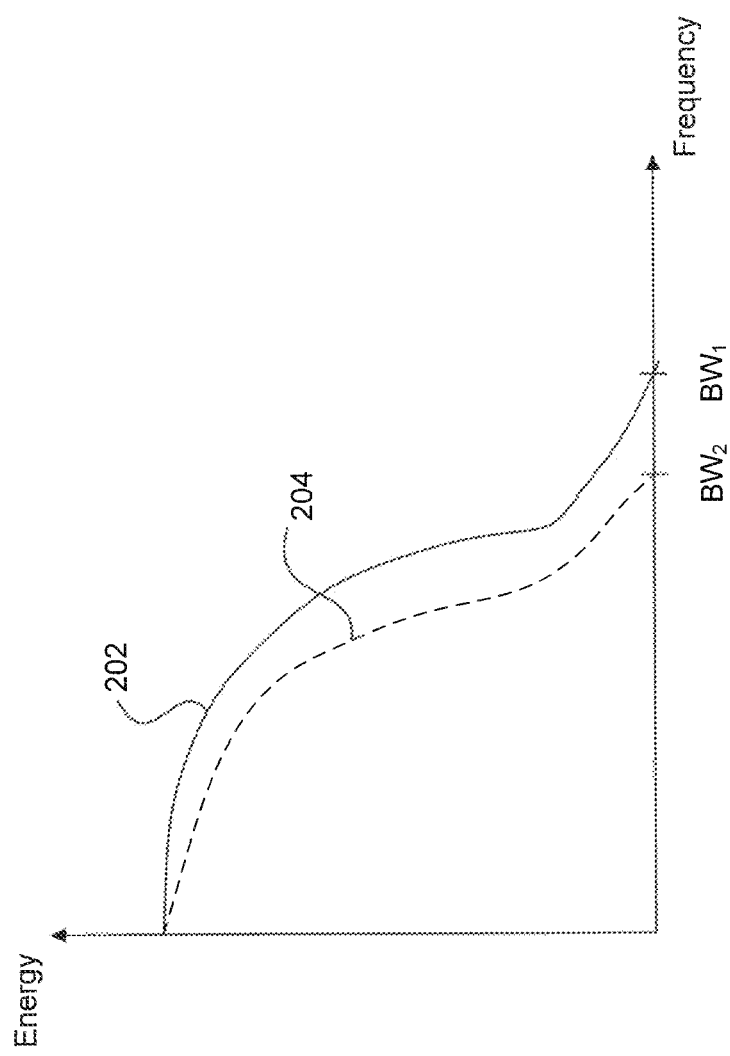
FIG. 2 is an example that illustrates the effect of the frequency response of the envelope tracking (ET) path on the bandwidth of the PA supply voltage.

FIG. 2 is an example 200 that illustrates the effect of the frequency response of the envelope tracking (ET) path on the bandwidth of the ET signal. In example 200, curve 202 represents the signal bandwidth of an ET signal, e.g., ET signal 112, before it is applied to the ET path. The ET signal has a bandwidth that is substantially similar to the bandwidth of the transmit signal. Curve 204 represents the signal bandwidth of PA supply voltage, e.g., PA supply voltage 108, which results from applying the ET signal to the ET path.

As shown in FIG. 2, the low-pass transfer function of the ET path causes the upper frequency components of the ET signal to be reduced substantially. As a result, the resulting PA supply voltage has a reduced bandwidth ($BW_2$) compared to the bandwidth ($BW_1$) of the ET signal, or, correspondingly, the transmit signal. Having lower bandwidth than the transmit signal that it is intended to track, the PA supply voltage may not be able to provide, at all times, the necessary voltage to produce the desired output waveform and/or to maintain the minimum headroom, as further described below. This results in increased unwanted emissions at the output of the PA.

Figure 3:
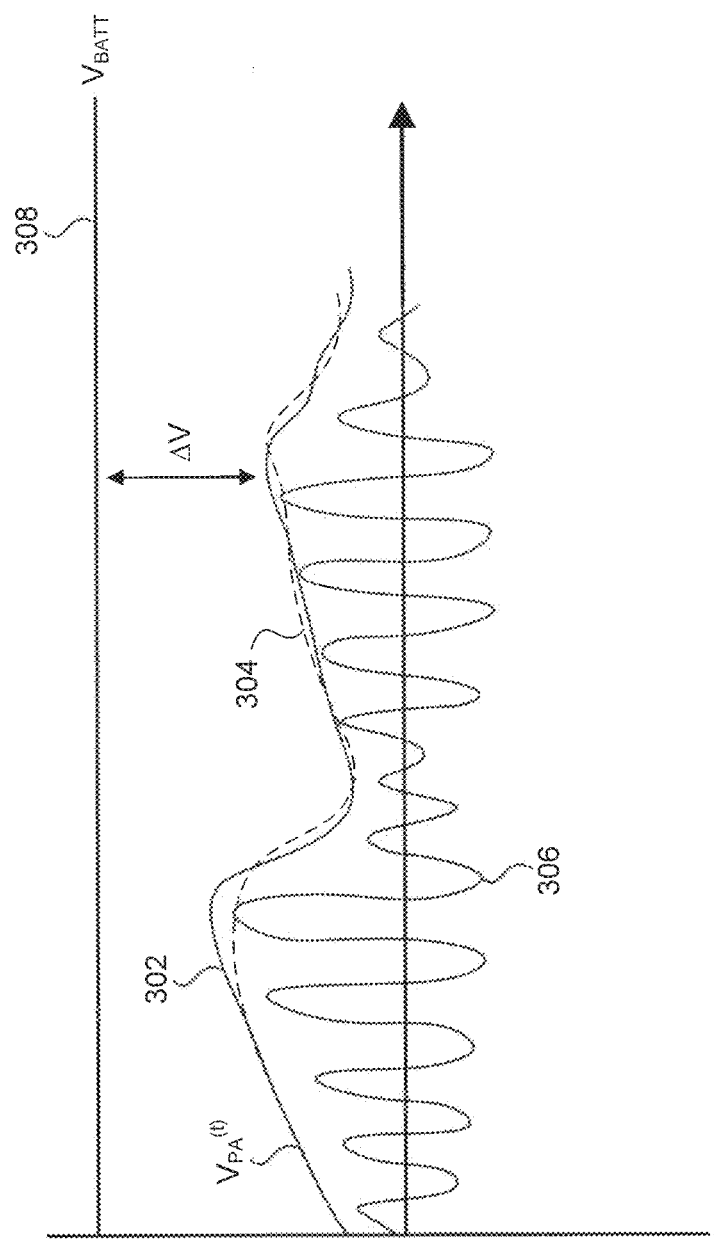
FIG. 3 is an example that illustrates the effect of the frequency response of the envelope tracking (ET) path on the envelope tracking performance of the PA supply voltage.

FIG. 3 is an example 300 that illustrates the effect of the frequency response of the envelope tracking (ET) path on the envelope tracking performance of the PA supply voltage.

In example 300, waveform 306 represents the desired RF output signal of the PA in the time domain. RF output signal 306 may be, for example and without limitation, a WiMAX (Worldwide Interoperability for Microwave Access) or a LTE (Long Term Evolution) waveform, with a high peak to average power ratio (PAPR).

Supply voltage curve 302 represents an ideal PA supply voltage that tracks waveform 306, so that at any time instant the PA is provided with the necessary and sufficient voltage to produce (without non-linear distortion) the desired output power of the desired RF output signal. Accordingly, as shown in FIG. 3, supply voltage 302 is time aligned with waveform 306. In addition, supply voltage 302 is such that the PA is provided a minimum headroom (typically few hundred milliVolts) above what is needed to maintain linearity of waveform 306. This headroom accounts for any temperature, process, or load impedance variations that may affect the performance of the PA.

Supply voltage curve 304 represents an actual PA supply voltage produced by applying the ET signal to a bandwidth-limited ET path, having lower bandwidth than necessary to pass substantially the entire bandwidth of the ET signal at all times. As shown in FIG. 3, supply voltage curve 304 may, at times, be aligned with the desired supply voltage curve 204, thus providing the minimum voltage headroom to the PA. However, when waveform 306 begins to exhibit large magnitude swings (i.e., when the transmit signal envelope is large), supply voltage curve 304 may not be able to maintain the minimum voltage headroom to the PA. As a result, supply voltage 304 may, at certain time instants, be below what is necessary to produce the instantaneous desired output power of waveform 306. When this occurs, the gain of the PA sags, resulting in clipping/distortion in the desired RF output signal of the PA and increased unwanted out-of-band emissions by the PA.

The above described problem becomes more pronounced in the case of waveforms with high PAPR (e.g., WiMAX, LTE, etc.), with frequent clipping occurring at the peaks of such waveforms. Accordingly, there is a need to produce a PA supply voltage that maintains a minimum headroom relative to the desired RF output signal of the PA.

Embodiments of the present invention, as further described below, provide systems and methods for producing an envelope tracking (ET) PA supply voltage with minimum headroom relative to the desired RF output signal of the PA. In an embodiment, the PA supply voltage is generated by applying an ET signal to an ET path of the wireless device, and by further applying pre-emphasis to the ET signal to compensate for a frequency response of the ET path. Embodiments operate by estimating the frequency response of the ET path and determining the pre-emphasis based on the estimate of the frequency response of the ET path. In embodiments, the pre-emphasis is applied using a pre-emphasis filter, which may be within or outside of the ET path. Further, the pre-emphasis may be applied to the ET signal in digital or analog form. The pre-emphasis function can account for the amplitude and/or phase response of the ET path.

In the following, example embodiments will be provided. These example embodiments are provided for the purpose of illustration and are not limiting. Embodiments will be described with reference to an example transmitter having a particular architecture. However, embodiments are not limited to this example transmitter, and can be extended to other transmitter architectures as would be understood by a person of skill in the art based on the teachings herein.

Figure 4:
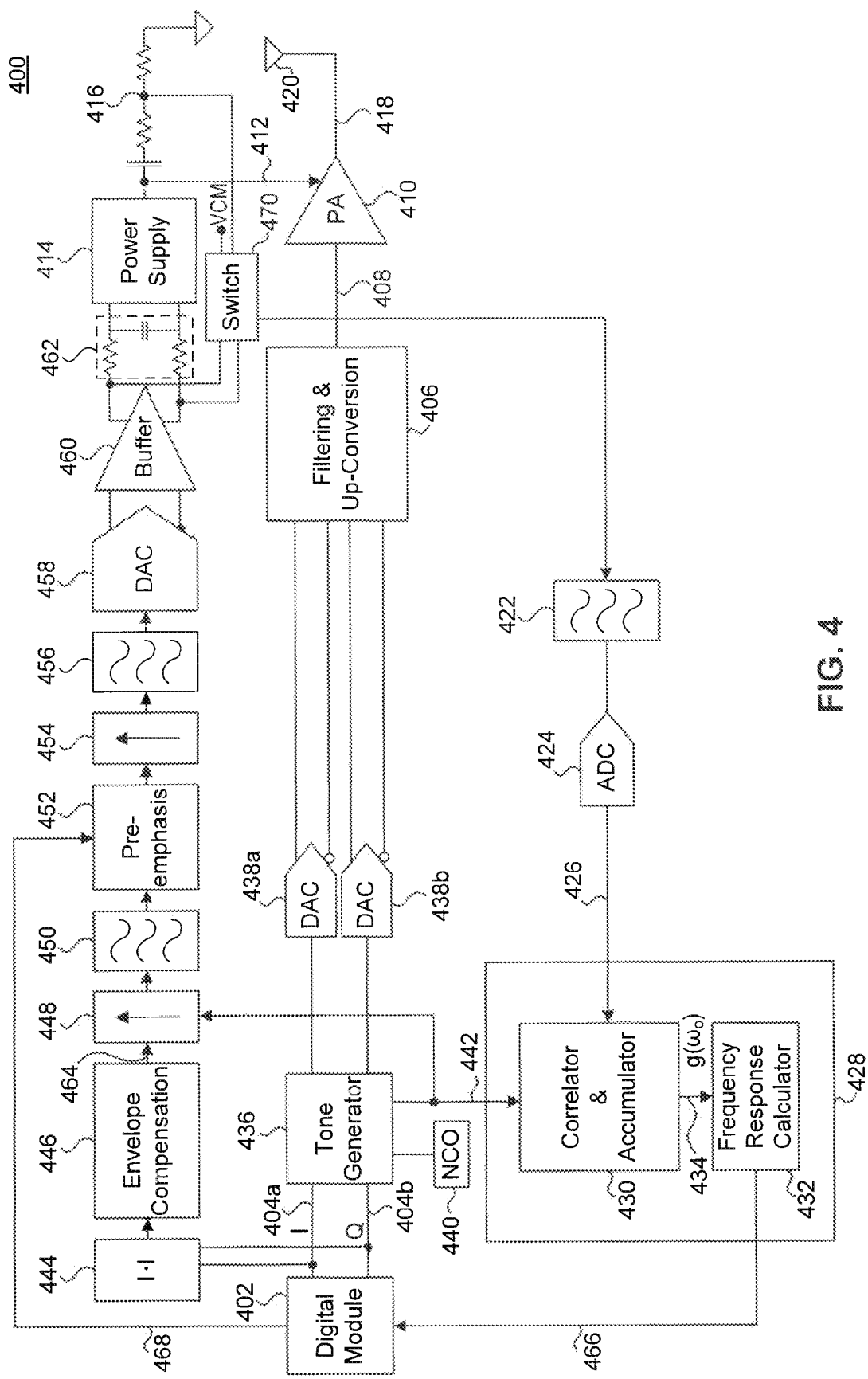
FIG. 4 illustrates an example RF transmitter according to an embodiment of the present invention.

FIG. 4 illustrates an example RF transmitter 400 according to an embodiment of the present invention. Example transmitter 400 can be used to perform embodiments of the present invention. As would be understood by a person of skill in the art based on the teachings herein, transmitter 400 may include more components than shown in FIG. 4, which are omitted herein for the purpose of simplification.

As shown in FIG. 4, example transmitter 400 includes a digital module 402; a transmit path, including digital-to-analog converters (DACs) 438a-b, filtering and up-conversion module 406, and PA 410; an antenna 420; and an envelope tracking (ET) path, including a first up-sampler 448, a first filter 450, a pre-emphasis filter 452, a second up-sampler 454, a second filter 456, a DAC 458, a buffer 460, an impedance network 462, and a power supply 414. In other embodiments, pre-emphasis filter 452 is not part of the ET path. For example, pre-emphasis filter 452 may be located before or after the ET path, and may be digital or analog.

Additionally, transmitter 400 includes, between digital module 402 and the ET path, an envelope generator module 444 and an envelope compensation module 446, which generate an ET signal based on the envelope of the transmit signal. Further, transmitter 400 includes a tone generator 436, a numerically controlled oscillator (NCO) 440, a frequency response estimator module 428, an analog-to-digital converter (ADC) 424, and a filter 422.

Digital module 402, which may be a baseband processor, generates digital in-phase (I) and quadrature-phase (Q) signals 404a and 404b based on an input signal to be transmitted. Signals 404a-b represent the transmit signal. Digital module 402 simultaneously provides signals 404a-b to the transmit path and to envelope generator module 444. In an embodiment, digital module 402 may pre-distort I and Q signals 404a and 404b to compensate for non-linearities in module 406 and PA 410. In embodiments, digital module 402 may be implemented using hardware and/or software components.

In the transmit path, DACs 438a-b convert signals 404a-b, respectively, from digital to analog, and provide the analog converted signals to filtering and up-conversion module 406. Filtering and up-conversion module 406 performs filtering (e.g., interpolation filtering) and frequency up-conversion on the analog signals, and then sums the resulting signals to generate RF signal 408.

PA 410 receives RF signal 408 from filtering and up-conversion module 406, and power amplifies RF signal 408 to generate an RF output signal 418 for transmission by antenna 420. In addition, PA 410 receives a supply voltage 412 from power supply 414. In an embodiment, power supply 414 is an envelope tracking (ET) power supply that generates supply voltage 412 based on an envelope tracking signal. The ET signal has a known relationship to the transmit signal, or, correspondingly, the desired output waveform of RF transmitter 400. As such, power supply 414 dynamically regulates PA supply voltage 412 according to the instantaneous power level of the desired output waveform, thereby allowing PA 410 to operate at high power efficiency. In an embodiment, PA 410 includes a field-effect transistor (FET), and supply voltage 412 is applied to a drain terminal of the FET.

To generate supply voltage 412, the transmit signal (I and Q signals 404a and 404b) is used to generate an ET signal 464, which then is applied to the ET path. Specifically, I and Q signals 404a-b are provided to envelope generator module 444, which computes the envelope or magnitude ($|I^2+Q^2|$) of the transmit signal. The computed envelope is then applied to envelope compensation module 446, which applies an appropriate compensation (e.g., scaling and offseting) to the computed envelope, to produce ET signal 464.

In the ET path, ET signal 464 is applied consecutively through first up-sampler 448, first filter 450, pre-emphasis filter 452, second up-sampler 454, second filter 456, DAC 458, buffer 460, impedance network 462, and power supply 414, to produce supply voltage 412.

Up-samplers 448 and 454 serve to increase the sample rate of ET signal 464. As a result, when subsequently converted from digital to analog by DAC 458, DAC produced images of the analog ET signal (a DAC typically produces a desired spectrum of the signal of interest and images of the same spectrum replicated at multiples of the sample rate) will occur at high frequencies and can be reduced or eliminated by the analog path at the output of DAC 458. For example, in an embodiment, an analog filter (not shown in FIG. 4) can be placed at the output of DAC 458 to eliminate the DAC produced images of the analog ET signal.

Filters 450 and 456 serve to reduce or eliminate any noise introduced by up-samplers 448 and 454, respectively.

Pre-emphasis filter 452 serves to apply pre-emphasis to ET signal 464 to compensate for the frequency response of the ET path, not including pre-emphasis filter 452. In other words, pre-emphasis filter 452 serves to flatten the frequency response of the ET path, including pre-emphasis filter 452, over a bandwidth of interest of the desired PA supply voltage. In an embodiment, pre-emphasis filter 452, which may be a finite impulse response (FIR) filter, boosts the components of an upper frequency range of the ET signal, to preserve substantially all of the bandwidth of the ET signal after being applied to the ET path. As further described below, in an embodiment, pre-emphasis filter 452 is configured to have a frequency response that is substantially equal to an inverse of an estimate of the frequency response of the ET path, not including pre-emphasis filter 452. In an embodiment, the inverse function accounts for both the magnitude and phase response of the ET path. n embodiments, pre-emphasis filter 452 may be placed within, before, or after the ET path, and may be implemented in digital or analog form. For example, in an embodiment, pre-emphasis filter 452 is placed before up-sampler 448.

DAC 458 converts the ET signal from digital to analog. The analog signal is provided to power supply 414, after being applied to buffer 460 and impedance network 462. Power supply 414 uses the analog ET signal to generate PA supply voltage 412. As such, supply voltage 412 tracks the envelope of the desired transmit signal, and PA 410 is supplied with as much voltage as instantaneously necessary to produce the desired output waveform.

As described above, in an embodiment, the pre-emphasis applied by pre-emphasis filter 452 is determined based on an estimate of the frequency response of the ET path. In example transmitter 400, this is performed by estimating the frequency response of the ET path and by configuring pre-emphasis filter 452 accordingly, as further described below.

To estimate the frequency response of the ET path, pre-emphasis filter 452 is first configured to have a flat frequency response, by setting, for example, only one of its coefficients to 1 and the remaining coefficients to 0. Tone generator 436 is then controlled to generate and apply tone samples 442 of a pre-determined frequency $\omega_0$ to the ET path. For example, tone generator 436 may apply a sine wave, a continuous wave signal, a chirp signal, or the ET signal to the ET path. A chirp signal is a swept frequency sine wave generator, where in the instantaneous frequency f(t) varies linearly or logarithmically with time. One example of a chirp signal can be defined as x(t)=sin [2*pi*(f0+k/2*t)*t], where f0 is the starting frequency of the tone and f(t)=f0+k*t. In embodiments, the chirp signal allows an efficient measurement of the frequency response of the ET path, in order to calculate the pre-emphasis function.

In an embodiment, the frequency $\omega_0$ of the tone generated by tone generator 436 is controlled by NCO 440, which in turn may be controlled by a phase step control signal (not shown in FIG. 4).

In an embodiment, the ET path is sampled at an output 416 of power supply 414 (via a switch 470, which is controlled to couple output 416 to filter 422) by filter 422 and ADC 424 to generate samples 426 of the PA supply voltage. Supply voltage samples 426 are then provided to frequency response estimator module 428. Simultaneously, tone samples 442, which result in supply voltage samples 426, are also provided to frequency response estimator 428. In another embodiment, the ET path is sampled at the output of buffer 460 or the input of ET power supply 414. In this embodiment, switch 470 is controlled to couple the output of buffer 460 or the input of ET power supply 414 to filter 422. Switch 470 may be controlled by a control signal from digital module 402.

Frequency response estimator 428 includes a correlator and accumulator module 430 and a frequency response calculator 432. Correlator and accumulator module 430 correlates tone samples 442 with supply voltage samples 426 to produce a correlation product, and integrates the correlation product over a pre-determined time window (e.g., 100 microseconds) to generate a complex gain (i.e., magnitude and phase) value $g(\omega_0)$ 434 of the ET path at the pre-determined frequency of the applied tone. Complex gain value 434 is then provided to frequency response calculator 432.

The above described process is repeated for various frequency values of interest for the applied tone. Specifically, NCO 440 controls tone generator 436 to sweep a range of useful frequencies for $\omega_0$ (e.g., in 1 MHz steps), thus producing a plurality of complex gain values 434. The complex gain values 434 are each in turn provided to frequency response calculator 434, which generates an estimate of the frequency response of the ET path based on the complex gain values 434. In another embodiment, the complex gain values are provided to digital module 402, instead of frequency response calculator 428, which can be eliminated in this embodiment.

Frequency response calculator 428 uses the complex gain values 434 to generate an estimate 466 of the frequency response of the ET path (not including pre-emphasis filter 452, which has its frequency response set to 1) and provides frequency response estimate 466 to digital module 402.

Digital module 402 uses frequency response estimate 466 to determine the pre-emphasis needed to compensate for frequency response estimate 466, and controls pre-emphasis filter 452 accordingly using a control signal 468. In an embodiment, digital module 402 computes filter coefficients for pre-emphasis filter 452 that substantially flatten the frequency response of the ET path, including pre-emphasis filter 452. In an embodiment, digital module 402 sets the coefficients of pre-emphasis filter 452 such that pre-emphasis filter 452 has a frequency response that is substantially equal to the inverse of frequency response estimate 466. With pre-emphasis filter 452 configured as such, PA supply voltage 412 is produced with sufficient bandwidth to accurately track, with minimum voltage headroom, the desired transmit signal.

For band-limited Gaussian transmit signals, approximately 80% of the envelope energy is at DC, and very little energy is present at higher frequencies. Accordingly, aggressive pre-emphasis (e.g., 6 to 8 dB relative to the desired signal) can be applied ET signal 464 to extend/boost up its bandwidth without adding significant energy to (or increasing the signal swing of) the ET signal. As such, embodiments require no increase in the dynamic range of DAC 458 to support the application of pre-emphasis to ET signal 464.

Figure 5:
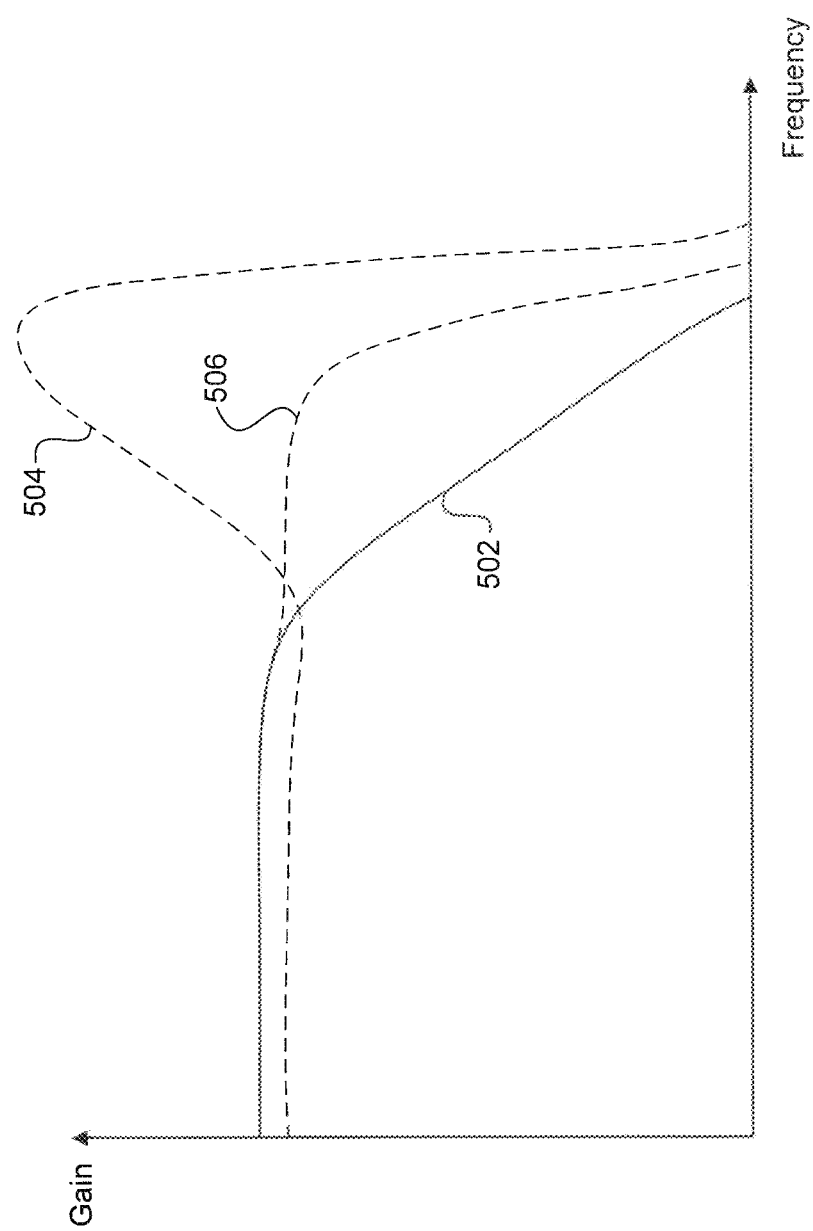
FIG. 5 is an example that illustrates the effect of applying pre-emphasis on the frequency response of the envelope tracking (ET) path.

FIG. 5 is an example 500 that illustrates the effect of applying pre-emphasis on the frequency response of the envelope tracking (ET) path. In example 500, frequency response curve 502 represents the frequency response of the ET path, not including the pre-emphasis filter (when the pre-emphasis filter is part of the FT path). Referring to FIG. 4, for example, curve 502 may be the frequency response of the ET path from up-sampler 448 to the output 416 of power supply 414.

Frequency response curve 504 represents the frequency response of a pre-emphasis filter (e.g., pre-emphasis filter 452), used to apply the pre-emphasis within, before, or after the ET path. As shown in FIG. 5, frequency response curve 504 is selected to have approximately an inverse relationship with frequency response curve 502, over a frequency range of interest where a gain boost of curve 502 is desired.

Frequency response curve 506 represents the aggregate frequency response of the ET path and the pre-emphasis filter. As shown in FIG. 5, frequency response curve 506 is boosted up relative to frequency response curve 502 over a portion of the bandwidth, so as to extend the bandwidth of the ET path. Accordingly, a larger bandwidth PA supply voltage can be produced from the ET path, resulting in better envelope tracking performance.

Figure 6:
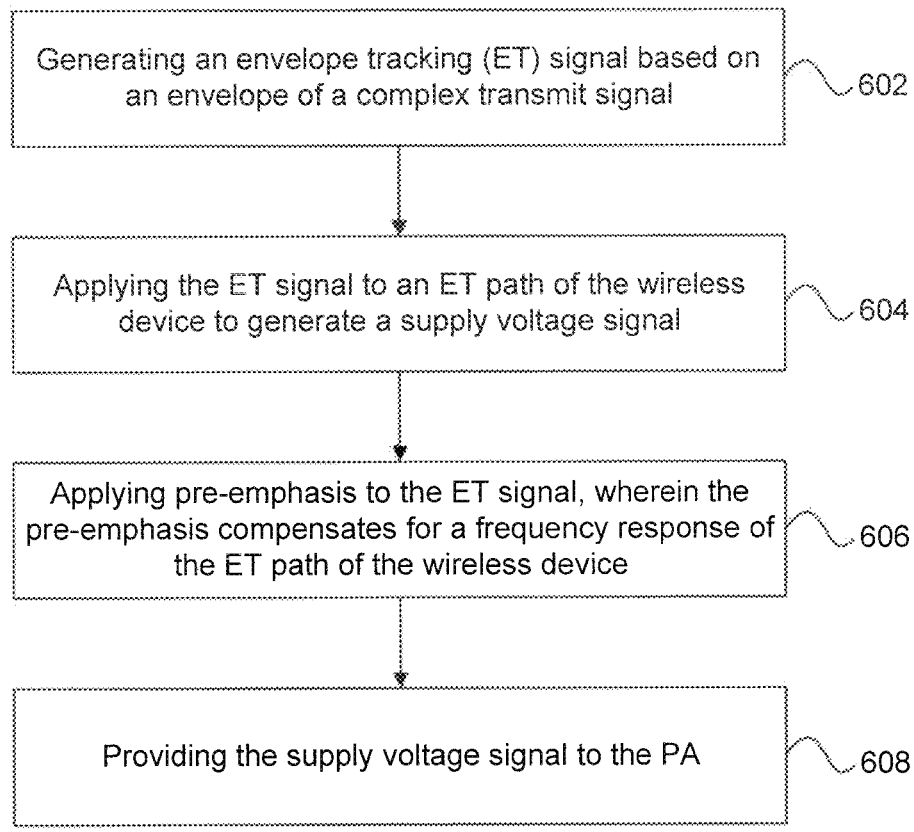
FIG. 6 is a process flowchart of a method according to an embodiment of the present invention.

FIG. 6 is a process flowchart 600 of a method of controlling a power amplifier (PA) in a wireless device according to an embodiment of the present invention.

As shown in FIG. 6, process 600 begins in step 602, which includes generating an envelope tracking (ET) signal based on an envelope of a complex transmit signal. In an embodiment, step 602 includes computing a magnitude of the complex transmit signal and then compensating the computed magnitude (e.g., scaling and offsetting it).

Process 600 continues at step 604, which includes applying the ET signal to an ET path of the wireless device to generate a supply voltage signal. The ET path of the wireless device serves to deliver a PA supply voltage signal that tracks the envelope of the complex transmit signal, being produced by the PA. In embodiment, step 604 further includes applying the ET signal to a power supply that produces the supply voltage signal.

In an embodiment, applying the ET signal to the ET path includes converting the ET signal from digital to analog using a digital-to-analog converter (DAC). As such, step 604 further includes up-sampling the ET signal to reduce digital-to-analog converter (DAC) produced images of the ET signal in the analog ET signal.

Process 600 then proceeds to step 606, which includes applying pre-emphasis to the ET signal, wherein the pre-emphasis compensates for a frequency response of the ET path of the wireless device. According to embodiments, step 606 may be performed before, together with, or as part of step 604.

In an embodiment, the pre-emphasis applied to the ET signal is determined by estimating a frequency response of the ET path (not including the element that applies the pre-emphasis, when that element is within the ET path) and then setting the pre-emphasis based on an inverse of the estimate of the frequency response of the ET path.

In an embodiment, the pre-emphasis to the ET signal is applied using a pre-emphasis filter, with coefficients of the pre-emphasis filter determined based on the estimate of the frequency response of the ET path. The pre-emphasis filter boosts components of an upper frequency range of the ET signal, thereby preserving substantially all of the bandwidth of the ET signal after being applied to the ET path. In other words, by applying the pre-emphasis to the ET signal, the low-pass filter effect of the ET path on the ET signal is reduced or eliminated.

In an embodiment, the frequency response of the ET path is estimated by (a) applying tone samples of a pre-determined frequency to the ET path; (b) sampling the supply voltage signal, resulting from the applied tone samples, to generate supply voltage samples; (c) correlating the tone samples with the supply voltage samples to produce a correlation product; and (d) integrating the correlation product over a pre-determined time window to generate a complex gain of the ET path at the pre-determined frequency. The pre-determined frequency is swept over a range of useful frequencies and steps (a)-(d) repeated, to generate a plurality of complex gain values. The estimate of the frequency response of the ET path is generated based on the plurality of complex gain values.

Finally, process 600 terminates in step 608, which includes providing the supply voltage signal to the PA. In an embodiment, the PA includes a FET, and the supply voltage signal is provided at a drain terminal of the FET.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A method for controlling a power amplifier (PA) in a wireless device, comprising:
    generating an envelope tracking (ET) signal based on an envelope of a complex transmit signal;
    applying the ET signal to an ET path of the wireless device to generate a supply voltage signal;
    applying pre-emphasis to the ET signal, wherein the pre-emphasis compensates for a frequency response of the ET path of the wireless device;
    providing the supply voltage signal to the PA; and
    estimating the frequency response of the ET path, the estimating including:

applying tone samples of pre-determined frequency to the ET path;

sampling the supply voltage signal, resulting from the applied tone samples, to generate supply voltage samples;

correlating the tone samples with the supply voltage samples to produce a correlation product;

integrating the correlation product over a pre-determined time window to generate a complex gain of the ET path at the pre-determined frequency; and generating an estimate of the frequency response of the ET path based on the complex gain of the ET path at the pre-determined frequency;

wherein the pre-emphasis is determined based on an inverse of the estimate of the frequency response of the ET path.

2. The method of claim 1, wherein generating the ET signal comprises computing a magnitude of the complex transmit signal and compensating the computed magnitude.

3. The method of claim 1, wherein applying the ET signal to the ET path of the wireless device comprises up-sampling the ET signal to reduce digital-to-analog converter (DAC) produced images of the ET signal.

4. The method of claim 1, wherein applying the ET signal to the ET path of the wireless device comprises applying the ET signal to a power supply that produces the supply voltage signal.

5. The method of claim 1, further comprising:

repeating the estimating of the frequency response of the ET path over a range of pre-determine frequencies to generate a plurality of complex gain values.

6. The method of claim 1, wherein applying the pre-emphasis to the ET signal comprises applying the ET signal to a pre-emphasis filter.

7. The method of claim 6, wherein the pre-emphasis filter boosts components of an upper frequency range of the ET signal, thereby preserving substantially all of a bandwidth of the ET signal after being applied to the ET path.

8. The method of claim 6, further comprising:

determining coefficients of the pre-emphasis filter based on an estimate of the frequency response of the ET path.

9. The method of claim 1, wherein the tone samples include one of:

a sinusoidal signal;

a continuous wave signal;

a chirp signal; and the ET signal.

10. The method of claim 1, wherein the tone samples are not proportional to the envelope of the complex transmit signal.

11. A wireless device, comprising:

a transmit path, including a power amplifier (PA), that receives a complex transmit signal and generates a radio frequency (RF) output signal at an output of the PA;

an envelope tracking (ET) path that receives an ET signal, based on an envelope of the complex transmit signal, and generates a supply voltage signal applied to the PA, wherein the ET path comprises a pre-emphasis filter that compensates for a frequency response of the ET path of the wireless device;

a tone generator that applies tone samples of a pre-determined frequency to the ET path;

an analog-to-digital converter (ADC) that samples the supply voltage signal, resulting from the applied tone samples, to generate supply voltage samples;

a correlator that correlates the tone samples with the supply voltage samples to produce a correlation product;

an accumulator that integrates the correlation product over a pre-determined time window to generate a complex gain of the ET path at the pre-determined frequency; and an estimator that estimates the frequency response of the ET path based on the complex gain of the ET path at the pre-determined frequency;

wherein the pre-emphasis filter is configured to have a frequency response substantially equal to an inverse of the estimate of the frequency response of the ET path.

12. The wireless device of claim 11, wherein the ET signal is generated using a magnitude of the complex transmit signal.

13. The wireless device of claim 11, wherein the ET path further comprises a digital-to-analog converter (DAC).

14. The wireless device of claim 13, wherein the ET path further comprises an up-sampler that up-samples the ET signal to reduce DAC produced images of the ET signal.

15. The wireless device of claim 11, wherein the ET path includes a power supply that produces the supply voltage signal applied to the PA.

16. The wireless device of claim 11, further comprising:

means for sweeping the pre-determined frequency over a range of frequencies to generate a plurality of complex gain values.

17. The wireless device of claim 11, wherein the pre-emphasis filter boosts components of an upper frequency range of the ET signal, thereby preserving substantially all of a bandwidth of the ET signal after being applied to the ET path.

18. The wireless device of 11, wherein the pre-emphasis filter includes a finite impulse response (FIR) filter.

* * * * *